(12) United States Patent
Dubois et al.

(10) Patent No.: US 9,058,983 B2
(45) Date of Patent: Jun. 16, 2015

(54) IN-SITU HARDMASK GENERATION

(71) Applicant: International Business Machines Corporation, Armonk, NY (US)

(72) Inventors: Geraud Jean-Michel Dubois, Los Altos, CA (US); Theo J. Frot, Los Gatos, CA (US); Teddie P. Magbitang, San Jose, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 13/919,725

(22) Filed: Jun. 17, 2013

(65) Prior Publication Data

US 2014/0367356 A1   Dec. 18, 2014

(51) Int. Cl.
*B44C 1/22* (2006.01)
*H01L 21/02* (2006.01)

(52) U.S. Cl.
CPC ....... *H01L 21/0226* (2013.01); *H01L 21/02203* (2013.01)

(58) Field of Classification Search
CPC .............. H01L 21/7682; H01L 21/02063; H01L 21/02203; H01L 21/3105; H01L 21/31116; H01L 21/76251; H01L 21/76256; H01L 21/31633; H01L 21/0203; H01L 21/0226; C23C 16/401
USPC ............... 438/700, 778; 216/12, 56
See application file for complete search history.

(56) References Cited

U.S. PATENT DOCUMENTS

| | | |
|---|---|---|
| 5,895,263 A | 4/1999 | Carter et al. |
| 6,399,666 B1 | 6/2002 | Hawker et al. |
| 7,078,352 B2 | 7/2006 | Beyer et al. |
| 7,229,934 B2 | 6/2007 | Dubois et al. |
| 7,238,604 B2 | 7/2007 | Kloster et al. |
| 7,268,200 B2 | 9/2007 | Townsend, III et al. |
| 7,282,458 B2 | 10/2007 | Gates et al. |
| 7,288,292 B2 | 10/2007 | Gates et al. |
| 7,291,446 B2 | 11/2007 | Mosden et al. |
| 7,312,524 B2 | 12/2007 | Gates et al. |
| 7,358,182 B2 | 4/2008 | Baks et al. |
| 7,479,306 B2 | 1/2009 | Edelstein et al. |
| 7,485,566 B2 | 2/2009 | Kawahara et al. |
| 7,767,587 B2 | 8/2010 | Fuller et al. |
| 8,133,805 B2 | 3/2012 | Dimitrakopoulos et al. |
| 8,314,005 B2 | 11/2012 | Purushothaman et al. |
| 8,540,890 B2 | 9/2013 | Baklanov et al. |
| 2005/0067702 A1 | 3/2005 | America et al. |
| 2005/0272265 A1 | 12/2005 | Geffken et al. |
| 2008/0009141 A1 | 1/2008 | Dubois et al. |
| 2012/0064713 A1 | 3/2012 | Russell et al. |
| 2012/0329273 A1* | 12/2012 | Bruce et al. ............... 438/653 |

OTHER PUBLICATIONS

K. Takeda et al., "Mechanism of plasma-induced damage to low-k SiOCH films during plasma ashing of organic resists," Journal of Applied Physics, 109, 033303 (2011) (6 pages).

(Continued)

*Primary Examiner* — Roberts Culbert
(74) *Attorney, Agent, or Firm* — Shumaker & Sieffert, P.A.

(57) ABSTRACT

In some examples, a process to generate an in-situ hardmask layer on porous dielectric materials using the densifying action of a plasma in conjunction with a sacrificial polymeric filler, the latter which enables control of the hardmask thickness as well as a well-defined interface with the underlying ILD.

26 Claims, 7 Drawing Sheets

(56) References Cited

OTHER PUBLICATIONS

T. Frot et al., "Post-Porosity Plasma Protection: A New Platform to Integrate k<2.4 Ultra Low-k Materials," Future Fab International, Issue 39, www.future-fab.com last printed Apr. 30, 2013 (7 pages).

T. Frot et al., "Application of the Protection/Deprotection Strategy to the Science of Porous Materials," Advanced Materials, 2011, 23, 2828-2832.

T. Frot et al., "Post Porosity Plasma Protection applied to a wide range of ultra low-k materials," Interconnect Technology Conference, 2012 IEEE International (3 pages).

T. Frot et al., "Post Porosity Plasma Protection a new approach to integrate k<2.2 porous ULK Materials," Interconnect Technology Conference, 2011 IEEE International (3 pages).

T. A. Spooner et al., "The Effect of Material and Process Interactions on BEOL Integration," ECS Transactions, vol. 25, Issue 7, pp. 279-289 (2009).

J. Sun et al., "Depth-profiling plasma-induced densification of porous low-k thin films using positronium annihilation lifetime spectroscopy," Appl. Phys. Lett., vol. 81, No. 8 (Aug. 19, 2002) 4 pages.

T. Abell et al., "Damage minimized plasma pore sealing of microporous low k dielectrics," Microelectron. Eng., 76, pp. 16-19 (2004).

H. J. Lee et al., "X-Ray Reflectivity and FTIR Measurements of N2 Plasma Effects on the Density Profile of Hydrogen Silsesquioxane Thin Films," Journal of the Electrochemical Society 148 (10) F195-F199 (2001).

T. Furusawa et al., "Oxygen Plasma Resistance of Low-k Organosilica Glass Films," Electrochemical and Solid-State Letters, 4 (3) G31-G34 (2001).

Frot et al., "Post Porosity Plasma Protection: Scaling of Efficiency with Porosity," Advanced Functional Materials, 22: 3043-3050. doi: 10.1002/adfm.201200152, Apr. 17, 2012, 10 pages.

\* cited by examiner

IN-SITU HARDMASK GENERATION

TECHNICAL FIELD

The disclosure generally relates to the formation of hardmasks on porous dielectric materials.

BACKGROUND

Modern dielectric patterning schemes, which allow the formation of metal conductors in the form of lines and vias, may be based on a dual damascene process. In one manifestation, this process may allow the formation of metal conductors from patterned vias and lines in a single metallization step, followed by the removal of excess metal by chemical-mechanical polishing (CMP). Due to the subtractive nature of this process (i.e., a blanket layer of the dielectric is typically patterned (material removal) by dry etch processes prior to metal deposition), the interlayer dielectric insulator (ILD) may be exposed to different etch chemistries, some of which can be very damaging to the ILD. An additional layer, generally referred to as a hardmask (HM), may need to be deposited on top of the ILD to allow for good pattern transfer control, photoresist (PR) rework as well as acting as a polish stop during CMP. This hardmask should exhibit good etch contrast with respect to the underlying ILD and adhere well to the dielectric material. Example hardmask materials include $SiO_2$, SiN and TiN.

SUMMARY

In some aspects, the present disclosure describes a process to generate an in-situ hardmask layer on porous dielectric materials using the densifying action of a plasma in conjunction with a sacrificial polymeric filler, the latter which enables control of the hardmask thickness as well as a well-defined interface with the underlying ILD. This presents a new and novel hardmask deposition scheme that is possible due to the synergistic interaction of the polymeric filler with the both the dielectric material and the particular plasma chemistry employed.

In one example, the disclosure is directed to a method comprising providing a structure comprising a layer overlying a substrate, wherein the layer comprises a silica-like dielectric material having a plurality of pores; at least partially filling a top portion of the layer with a filling material; exposing the top portion of the layer to a plasma such that: (i) the top portion of the layer, which faces the plasma, becomes a dense non-porous silicon-containing layer, the plasma consuming all the filling material in the top portion, so that no subsequent burn-out of the filling material in the top portion is required, (ii) the bottom portion of the layer, adjacent to the top portion, remains substantially unaffected by the plasma, and (iii) a modified structure results that includes the dense non-porous layer, the bottom portion, and the substrate; after forming the dense non-porous layer, performing at least one process on the modified structure; and after performing the at least one process, removing all or a portion of the dense non-porous layer.

In another example, the disclosure is directed to a method at least partially filling a top portion of a layer with a filling material, wherein the layer overlays a substrate, wherein the layer comprises a silica-like dielectric material having a plurality of pores; and exposing the top portion of the layer to a plasma such that: (i) the top portion of the layer, which faces the plasma, becomes a dense non-porous silicon-containing layer, the plasma consuming all the filling material in the top portion, so that no subsequent burn-out of the filling material in the top portion is required, (ii) the bottom portion of the layer, adjacent to the top portion, remains substantially unaffected by the plasma, and (iii) a modified structure results that includes the dense non-porous layer, the bottom portion, and the substrate.

In another example, the disclosure is directed an article formed via the example methods described herein.

The details of one or more embodiments of the disclosure are set forth in the accompanying drawings and the description below. Other features, objects, and advantages of the disclosure will be apparent from the description and drawings, and from the claims.

DETAILED DESCRIPTION

Figure 1:
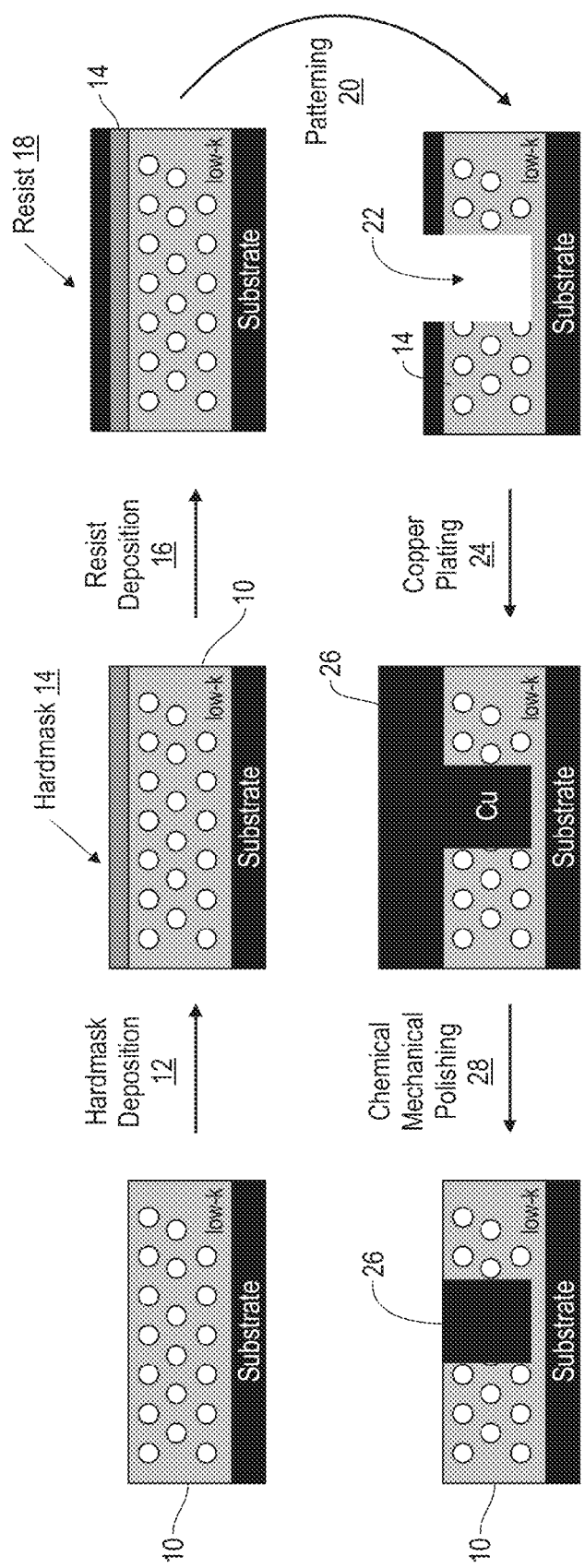
FIG. 1 is a schematic process flow diagram illustrating an example process.

As described above, modern dielectric patterning schemes may require a hardmask (HM), and may need to be deposited on top of the ILD to allow for good pattern transfer control, photoresist (PR) rework as well as acting as a polish stop during CMP. FIG. 1 is a schematic process flow diagram illustrating an example process including the deposition 12 of a hardmask 14 layer on the surface of ILD 10, followed by resist deposition 16 to form resist layer 18 on hardmask 14. Following deposition, there may be an ensuing patterning process 20 to form cavity 22 in ILD 10, which may be filled with Cu 26 during a copper plating process 24, and finally CMP 28, to remove the Cu overburden as well as the underlying hardmask 14.

Figure 2:
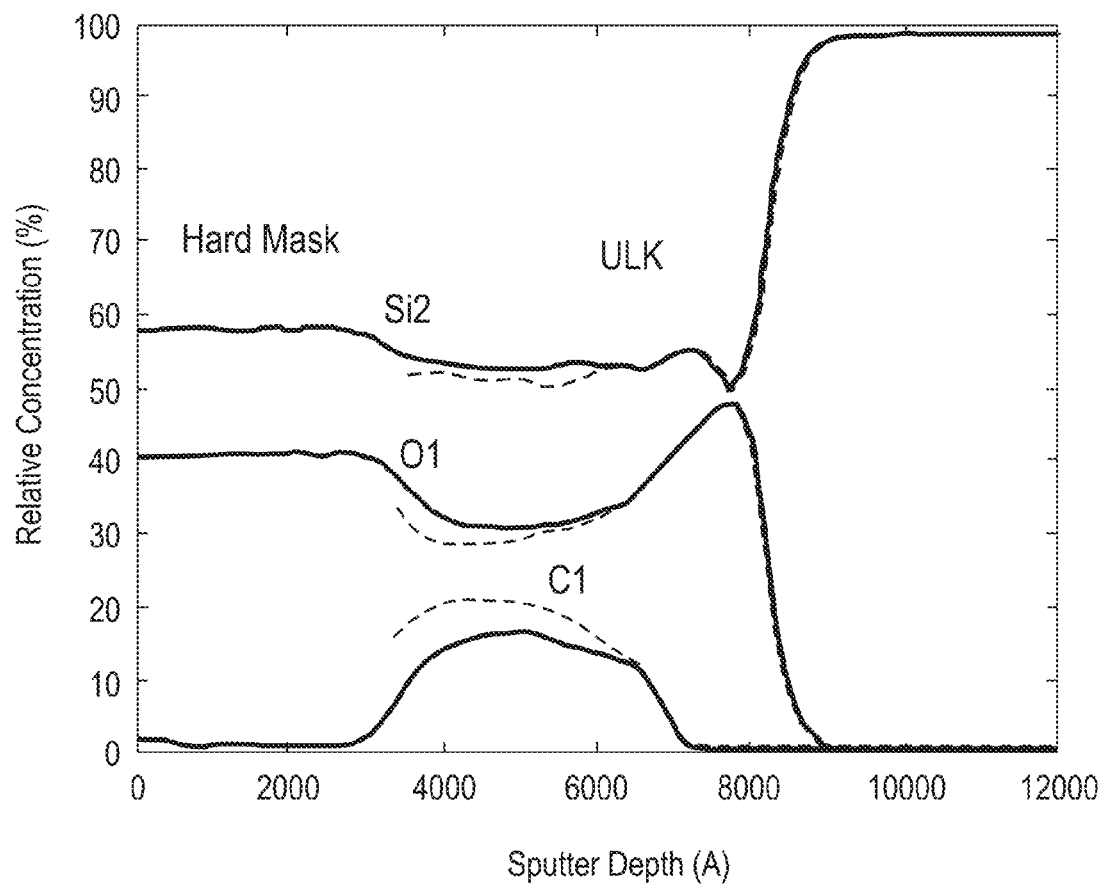
FIG. 2 is a plot of sputter depth versus relative elemental concentration in an example ILD for carbon, silicon, and oxygen, indicating ILD damage after hardmask deposition.

While hardmask deposition has become standard practice in dual damascene processing, it presents several problematic issues, particularly with the integration of porous, low dielectric constant ILDs. For example, the harsh deposition conditions encountered with $SiO_2$, SiN or TiN hardmasks, may result in significant ILD damage in the form of carbon depletion and ILD densification. As an illustration, FIG. 2 is a plot of sputter depth versus relative elemental concentration in an example ILD for carbon, silicon, and oxygen. In FIG. 2, the dotted lines represent the elemental composition of the virgin ILD, while the solid lines indicate the composition after hardmask deposition. As indicated in FIG. 2, following the hardmask deposition, there was a decrease in carbon content of the ILD with a corresponding increase in oxygen and silicon content at sputter depths between about 3000 to 7000 angstroms. The carbon depletion and ILD densification associated with such changes in relative composition due to hardmark deposition represents a form of undesirable ILD damage.

Figure 3:
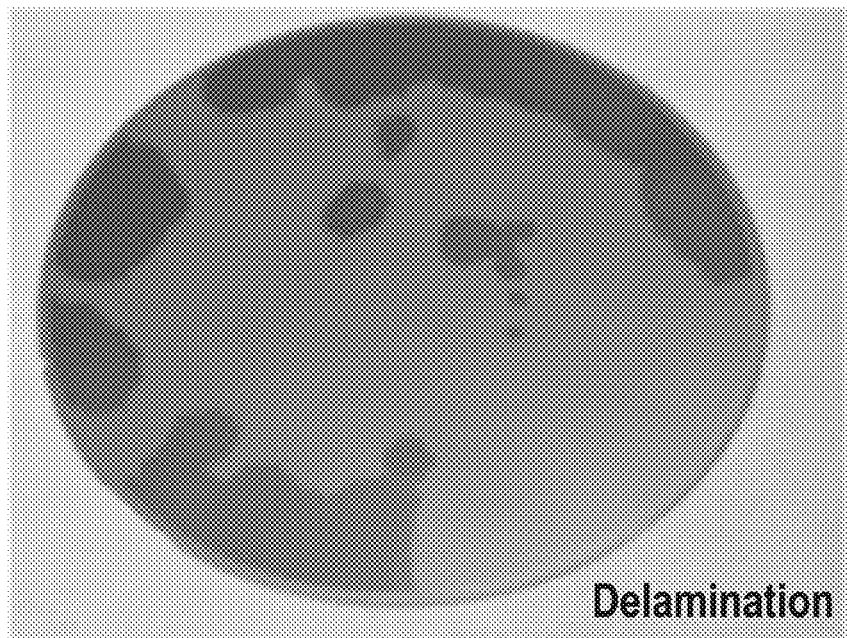
FIG. 3 is a photograph of an example ILD illustrating delamination of the dual hardmask layer during CMP.

As a result of the deposition damage, in some examples, a dual hardmask approach may be employed. In such an approach, a first hardmask can be deposited under comparatively mild deposition conditions, e.g., conditions that result little ILD damage, followed by deposition of the second hardmask, e.g., comprised of $SiO_2$, SiN, or TiN. While this approach may yield significantly lower ILD damage, e.g., for ILDs with a dielectric constant, k, greater than 2.4, increasing damage to the ILD is observed for ILDs with k less than 2.4. Furthermore, the introduction of two interfaces in the dual hardmask scheme, where one interface (hardmask 1/ILD interface) has been deposited under mild deposition conditions (e.g., conditions not conducive to high interfacial adhesion), can also lead to hardmask delamination during CMP. FIG. 3 is a photograph of an example ILD with two hardmasks. As indicated by the light areas, delamination of the hardmask layers occurred following CMP.

Figure 4:
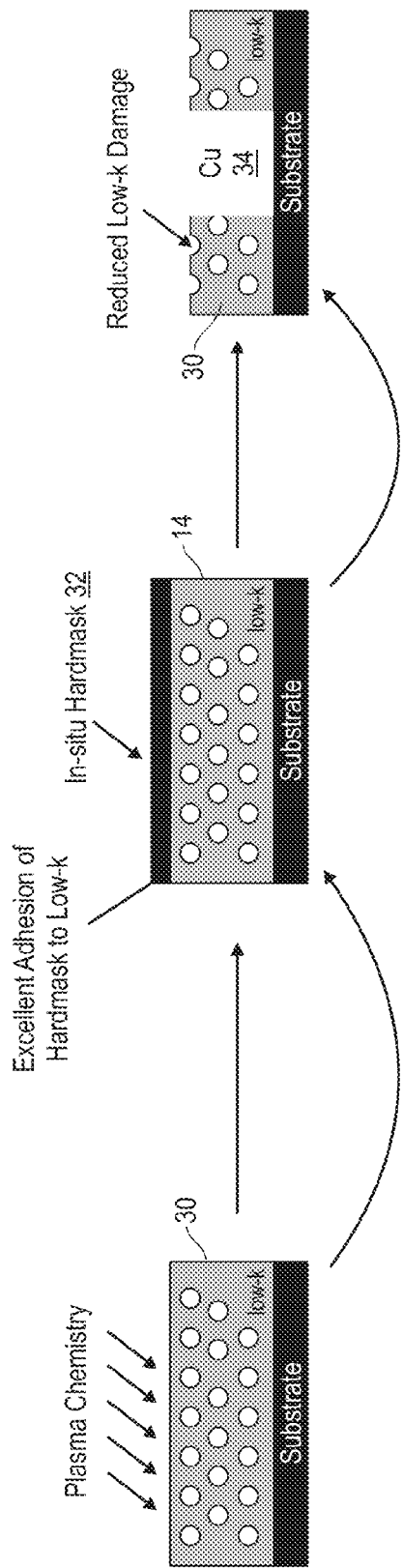
FIG. 4 is a schematic process flow diagram illustrating an example in-situ hardmask technique.

In light of such shortcomings, alternative hardmask deposition schemes which are less damaging, e.g., to porous ULK dielectric materials, may be desirable. Along these lines, in some examples, techniques may include the in-situ formation of hardmasks derived directly from densification and oxidation of typical SiCOH based ILDs. FIG. 4 is a schematic process flow diagram illustrating such an example technique. As shown in FIG. 4, porous ILD layer 30 formed of SiCOH material may be exposed to plasma to generate in-situ hardmask 32 on the surface of porous layer 30 as a result of the densification and oxidation of the SiCOH material. ILD 30 may undergo further processing, such as, e.g., photoresist deposition, patterning, and copper plating, followed by CMP as described with regard to FIG. 1, to remove hardmask 32 and form via 34. Such an example process may be derived based on the instance of densification and oxidation of porous organosilicate based dielectric materials when exposed to oxygen-rich etch plasmas typically utilized in PR removal strip processes.

Although such a process may lead to good adhesion between the hardmask and underlying ILD, damage to the underlying ILD in the form of a carbon-deficient gradient layer may still be present, e.g., although to a lesser degree. To evaluate the damage in the form of a carbon-deficient gradient layer, various examples were prepared using the described in-situ process and then evaluated. The presence of a carbon-deficient gradient layer is reflected in the x-ray reflectivity measurements of the resulting examples shown in Table 1. In Table 1, the examples were evaluated after the hardmasks were removed using wet chemical techniques. In a desirable case, only an undamaged layer would remain after hardmask removal. As evidenced by the x-ray results, a gradient structure, which appears in the form of a remaining damaged layer of higher density than the bulk material, is observed on top of the undamaged ILD. This represents a shortcoming of such an in-situ hardmask formation approach for porous ILDs.

| ILD | Damaged Layer | | Undamaged Layer | |
|---|---|---|---|---|
| | Density (g/cm$^3$) | Thickness (nm) | Density (g/cm$^3$) | Thickness (nm) |
| SiCOH, k = 2.0, Virgin material | — | — | 0.920 | 555 |
| SiCOH, k = 2.0, After SiO$_2$ HM Dep | 1.020 | 41 | 0.918 | 505 |
| SiCOH, k = 2.0, In-situ HM formation | 1.020 | 22 | 0.920 | 519 |

In addition, the residual higher density material at the top of the pristine ILD may provide a potential pathway to electrical failure in the final device in the form of electro-migration and time-dependent dielectric breakdown (TDDB). Although the slightly damaged region is relatively thin, it does not scale with film thickness and thus may represent an issue for future technology nodes.

In accordance with one or more examples of the disclosure, an example process for generating an in-situ hardmask layer, e.g., which may address one or more deficiencies identified above, is described. An example process may include the generation of an in-situ hardmask layer on porous dielectric materials using the densifying action of a plasma in conjunction with a sacrificial polymeric filler in at least a portion of the porous dielectric material. The sacrificial polymeric filler may enable the control of the hardmask thickness as well as provide a well-defined interface with the underlying ILD. Such a hardmask deposition process may be possible due to the synergistic interaction of the polymeric filler with the both the dielectric material and the particular plasma chemistry employed.

Figure 5:
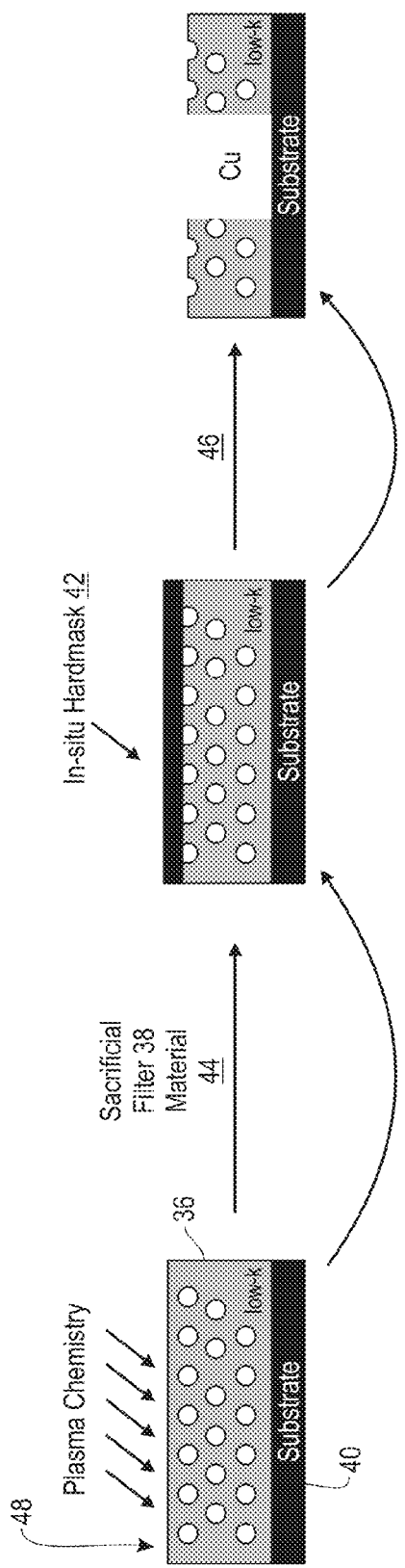
FIG. 5 is a schematic flow diagram illustrating one example process in accordance with the present disclosure.

FIG. 5 is a schematic flow diagram illustrating one example process in accordance with the present disclosure. As illustrated in FIG. 5, ILD 48 initially includes porous layer 36 overlying substrate 40. The pores of at least a portion of porous layer 36 may be filled with sacrificial filler material 38. ILD 48 may be subjected to one or more standard plasma processes 44 in which porous layer 36 is exposed to plasma. The exposure of ILD 48 to plasma in combination with the filler material in pores of the porous material results in the formation of hardmask 42 on the surface of porous layer 36. Following the formation of hardmask 42, ILD 48 may undergo further processing 46, e.g., as described with regard to FIG. 4, followed by removal of hardmask 42 using wet or dry chemistry techniques. Depending on the amount and type of filler material 38, as well as the plasma process conditions, at least a portion of the filler material 38 may remain in pores of ILD 48. The remaining filler material 38 may be removed using one or more suitable techniques, such as, heat treatment. In other examples, substantially all of filler material 38 in porous layer 36 may be consumed by the formation of hardmask 42.

Figure 6A:
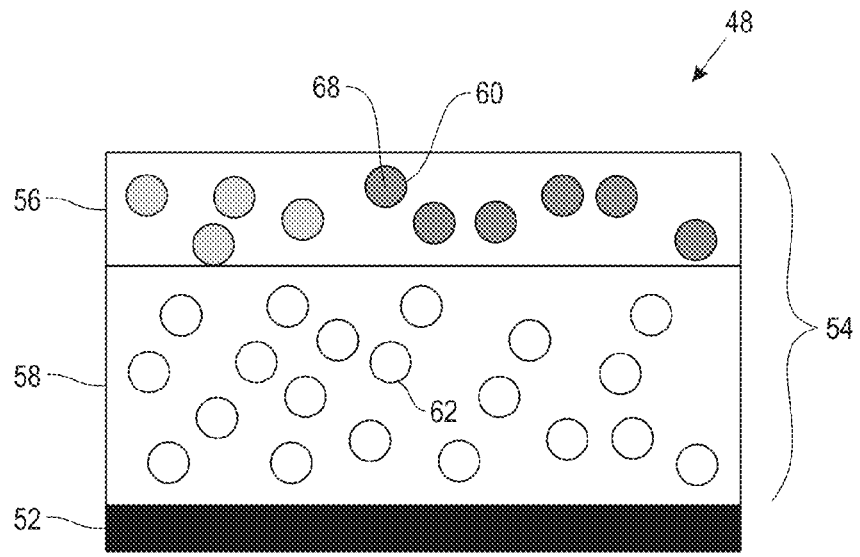
FIGS. 6A and 6B are conceptual diagrams illustrating an example ILD before and after, respectively, the formation of an in-situ hardmask using the process of FIG. 5.
Figure 6B:
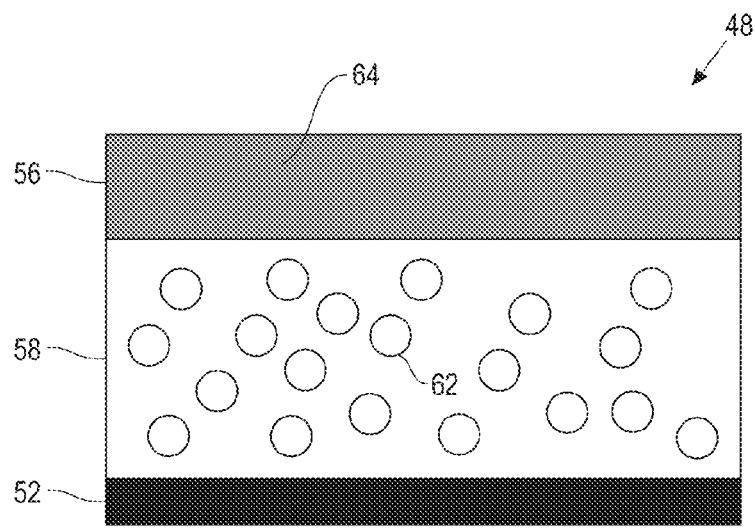

FIGS. 6A and 6B are conceptual diagrams illustrating an example ILD 48 before and after, respectively, the formation of an in-situ hardmask 64, e.g., using the process of FIG. 5. In FIG. 6A, ILD 48 includes porous layer 54 overlying substrate 52. Porous layer 54 may comprise a silica-like dielectric material including a plurality of pores, such as, e.g., pores 60, 62, and may be deposited on substrate 52 using one or more suitable techniques. Example silica-like dielectric materials comprise at least one of methyl silsesquioxane (MSSQ), hydrogen silsesquioxane (HSQ), oxycarbosilane (OCS), silica, copolymers thereof and aromatic thermoset polymers such as the Silk® Semiconductor Dielectric or Flare®, as non-limiting examples. Non-limiting examples of suitable porous dielectric materials include those mentioned in the following U.S. Pat. Nos. 7,479,306, 7,312,524, 7,288,292, 7,282,458, and 7,229,934. Further non-limiting examples of suitable porous dielectric materials include those mentioned in U.S. Patent Application Publication Number 2008/0009141.

Porous layer 54 may exhibit one or more properties in accordance with some examples of the disclosure. For example, porous layer 54 may exhibit a porosity greater than approximately 25% but less than 80%, preferably between 25 and 50%. In some examples, the porosity may be substantially homogenously distributed through layer 54. The average pore diameter of the plurality of pores in porous layer 54, including pores 60, 62, may be greater than 1 nanometer (nm), such as, e.g., between about 1 nm and about 3 nm. Porous layer 54 may be a relatively low dielectric constant, k, material (e.g., where k is less than 2.4). Other values for the above properties of porous layer 54 are contemplated.

As shown in FIG. 6A, porous layer 54 includes top portion 56 and bottom portion 58. At least a portion of the pores of top portion 56, such as, pore 60, may initially be filled with filler material 68. For example, approximately at least 10% and preferably between 25 and 100% of the pores should be filled. Conversely, as reflected in FIG. 6A, in some examples, the pores (e.g., pore 62) of bottom portion 58 of porous layer 54 may remain open, or at least not filled with filler material 68. In other examples, at least some of the pores of bottom portion 58 may also be filled with filler material 68 of top portion. In some examples, substantially all of the pores of both top portion 56 and bottom portion 58 may be filled with filler material 68. Top portion 56 may have a thickness of between approximately 10 and 100 nm although other thicknesses are contemplated.

The filler material may be deposited by standard solution spin-apply methods. The filler material depth of penetration is readily controlled by the molecular weight of the filler, glass transition temperature of the filler in conjunction with careful control of the post-apply bake temperature and time.

As described herein, when exposed to plasma during plasma processing, filler material 68 in combination with material of top layer 56 generates hardmask 64, which is a dense, non-porous, silicon-containing layer. The dielectric material can be refilled with polymers using techniques known in the art. In one exemplary embodiment, the decomposable polymer is a linear or branched polymer selected from the group of polyimides, polyamic acid, poly(amic alkyl esters), polybenzoxazoles, polyarylene ethers, polyarylenes, parylenes, polynaphtalenes, silicon-substituted polyimides, polyquinoxalines, poly(2-alkyl oxazolines), poly(N,N-dialkylacrylamides), poly(caprolactones), polyesters, polylactides, polystyrenes, substituted polystyrenes, poly-alpha methylstyrene, substituted poly-alpha methyl polystyrenes, aliphatic polyolefins, polynorbornenes, polyacrylates, polymethacrylates, and polyethers. Among the latter, particularly polyethylene oxide, polypropylene oxide and polytetrahydrofuran are preferred. The decomposable polymer is preferably a linear polymer, a linear di or tri-block copolymer, hyperbranched or a polymeric unimolecular amphiphile. Reference is made to U.S. Pat. Nos. 5,895,263 and 6,399,666 for further examples of suitable decomposable polymers, the content of which is hereby incorporated by reference. Organic compounds which are known by those skilled in the art to function as pore generators, include compounds such as cyclodextrin derivatives, etc. Example filler materials are capable of penetrating the pores of layer 54 upon heating above ambient temperatures. The formation of SiOx follows carbon removal by cleavage of Si—C bonds.

In cases in which filler material 68 comprises a polymer, the polymer may exhibit a desirable degradation temperature, such as, e.g., greater than about 250 degrees Celsius, such as greater than about 400 degrees Celsius. Further, filler material 68 may comprise a polymer with a dispersity index between 1 and 2, preferably between 1 and 1.2. In some examples, if the dispersity index of the polymer is outside this range only a portion of the filler may suitable for pore filling. In some examples, filler material 68 may comprise a polymer with molecular weight greater than about 500 daltons. If the molecular weight of the polymer is too low, the polymer may not exhibit sufficient thermally stability to undergo the processing described herein. In cases in which filler material 68 comprises an organic compound, the compound may exhibit a desirable degradation temperature, such as, e.g., greater than about 250 degrees Celsius.

In accordance with examples of the disclosure, top portion 56 may be exposed to plasma such that: (i) top portion 56 of porous layer 54, which faces the plasma, becomes a dense, non-porous, silicon-containing layer, the plasma consuming all filling material 68 in top portion 56, (e.g., so that no subsequent burn-out of filling material 68 in top portion 56 is required); (ii) bottom portion 58 of layer 54, adjacent to the top portion, remains substantially unaffected by the plasma; and (iii) a modified structure (shown in FIG. 6B) results that includes the dense, non-porous layer 64, bottom portion 58, and substrate 52.

Following the exposure, ILD 48, having the modified structure shown in FIG. 6B, may undergo further processing with dense, non-porous layer 64 functioning as a hardmask. Further processing may include, e.g., photoresist deposition, patterning by etching, and/or copper plating. Once completed, all or a portion of dense, non-porous layer 64 (hardmask) may be removed using wet or dry chemistry. Suitable techniques include CMP, dilute based or acid based wet chemistries, such as TMAOH and HF, respectively. All known plasma chemistries known for dry etch and cap-open processes.

Dense, non-porous, silicon-containing layer 64 may exhibit one or more desirable properties. In general, the layer 64 may have a density higher than 1.4 g/cm$^3$, preferably between 1.8 and 2.3 g/cm$^3$. The composition of layer 64 may be expressed by the empirical formula $Si_xC_yO_zH_a$, which can be influenced by incorporation of some of the filling material during the plasma exposure.

Dense, non-porous layer 64 may have a thickness that allows layer 64 to function as a hardmask. In some examples, layer 64 may have a thickness between approximately 5 nm and 100, preferably between 5 nm and 50 nm. Since the mechanism by which layer 64 is formed is self-limiting, the thickness of layer 64 may be controlled by how much organic filler is present in the pores. For example, as the percentage of the pores filled with filling material 68 increases, the thickness of dense layer 64 decreases. Thus, the percentage of the pores filled may be selected to provide for a desired thickness of layer 64. The self-limiting nature of the process also ensures little or no damage to the underlying dielectric material of bottom portion 58 irrespective of the porosity level.

Furthermore, the nature of the polymeric filler and the plasma chemistry may also play a role with respect to the thickness of layer 64. In some examples, aromatic filler materials, known to strongly absorb UV radiation, may be particularly effective in the presence of plasmas with significant UV components. This would lead to thinner hardmask layers.

As noted above, bottom portion 58 may remain substantially unaffected by the exposure of top layer 56 to plasma to form dense layer 64. That is, portion 58 reflects the porosity and chemical composition of the starting ILD (this can be established by X-ray reflectivity as well as SIMS and RBS analyses). In cases in which bottom layer 58 included at least some pores filled with filling material 68, to the extent that any filling material remains in the pores of bottom layer 58 following the exposure of top portion 56 to plasma, any remaining filler material may be removed from bottom portion 58, e.g., via a burn-out process such as heat treatment at a temperature greater than 250° C. and less than 450° C., preferably between 300° C. and 400° C. In other examples, only the pores of top layer 56 are filled with filling material 67 and the pores of bottom layer 58 are unfilled. By doing so, it is possible to form an in-situ hardmask (dense layer 64) as described herein via exposure to plasma. However, in such a case, substantially all of the filling material 64 may be consumed during the hardmask formation via plasma treatment. As such, no further processing is required to remove excess filling material 68 in bottom layer 58 as in the other example described above.

EXAMPLE

Figure 7:
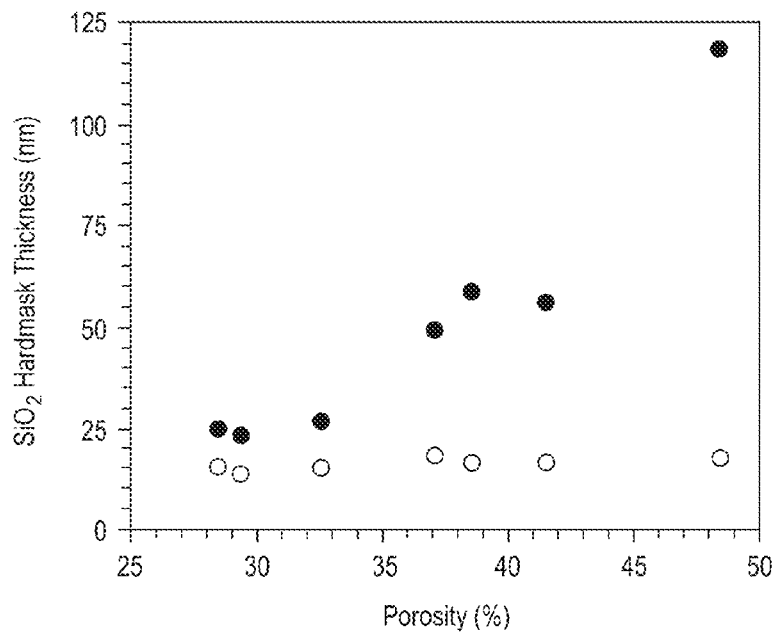
FIG. 7 compares hardmask thickness as a function of porosity.
Figure 8:
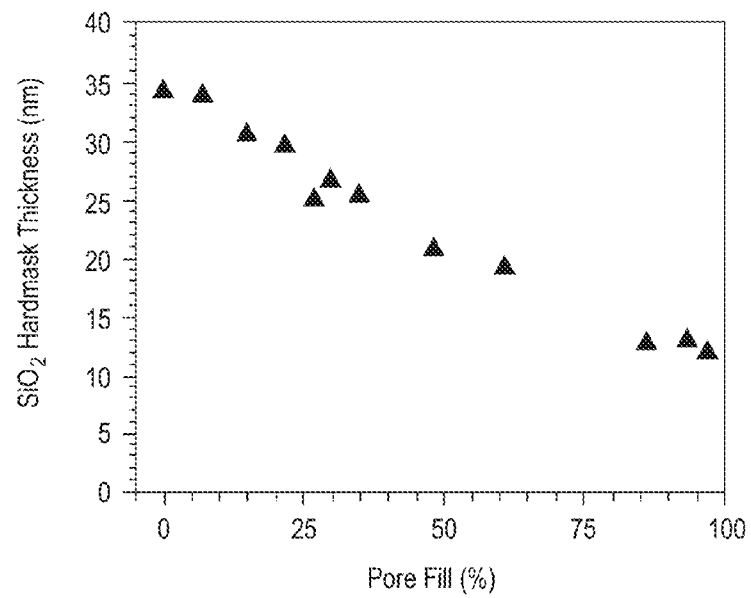
FIG. 8 illustrates hardmask thickness as a function of pore filling for a fixed porosity.

A series of tests were carried out on various samples to evaluate one or more aspects of some examples of the disclosure. It was discovered that the plasma damage to the porous ILD filled with an organic material appears to be self-limiting in nature. This is illustrated in FIG. 7, which compares the in-situ generated hardmask thickness of unfilled (black circles on plot) and completely filled (empty circles on plot) porous SiCOH-based ILDs as a function of porosity. As expected, in case of the unfilled system, the in-situ generated hardmask thickness (plasma damage) increases with increasing porosity. In contrast, the corresponding fully filled materials exhibit a constant hardmask thickness independent of porosity. This indicated the self-limiting nature of the plasma damage/hardmask formation in case of the fully filled systems, which may be particularly useful for highly porous ILDs. In addition, by carefully controlling the amount of organic material that homogeneously infiltrated into the porous structure, it was found that the hardmask thickness could be varied as shown in FIG. 8, which is a plot of in-situ generated hardmask thickness as a function of pore fill percentage.

Various embodiments of the invention have been described. These and other embodiments are within the scope of the following claims.

The invention claimed is:
1. A method comprising:
  providing a structure comprising a layer overlying a substrate, wherein the layer comprises a silica-like dielectric material having a plurality of pores;
  at least partially filling a top portion of the layer with a filling material;
  exposing the top portion of the layer to a plasma such that:
    (i) the top portion of the layer, which faces the plasma, becomes a dense non-porous silicon-containing layer, the plasma consuming all the filling material in the top portion, so that no subsequent burn-out of the filling material in the top portion is required,
    (ii) the bottom portion of the layer, adjacent to the top portion, remains substantially unaffected by the plasma, and
    (iii) a modified structure results that includes the dense non-porous layer, the bottom portion, and the substrate;
  after forming the dense non-porous layer, performing at least one process on the modified structure; and
  after performing the at least one process, removing all or a portion of the dense non-porous layer.
2. The method of claim 1, wherein the thickness of the dense non-porous layer is controlled by the filling material.
3. The method of claim 1, wherein the top portion has a thickness between 10 and 100 nm.
4. The method of claim 1, wherein the filling material includes a polymer.
5. The method of claim 4, wherein the polymer has a degradation temperature greater than 400 C.
6. The method of claim 4, wherein the polymer has a polymer dispersity index of between 1 and 2.0.
7. The method of claim 1, wherein the removing includes using a wet etch process.
8. The method of claim 1, wherein the top portion of the layer has porosity greater than 25% and an average pore diameter greater than 1 nm.
9. The method of claim 1, wherein a bottom portion of the layer is left unfilled.
10. The method of claim 1, wherein a bottom portion of the layer is at least partially filled.
11. The method of claim 10, wherein after said removing step, any remaining filler material in the bottom portion is removed.
12. The method of claim 10, wherein the thickness of the dense non-porous layer is controlled by the filling material.
13. The method of claim 10, wherein the top portion has a thickness between 10 and 100 nm.
14. The method of claim 10, wherein the filling material includes an organic compound.
15. The method of claim 14, wherein the organic compound has a degradation temperature greater than 250° C.
16. The method of claim 1, wherein the filling material includes a polymer.
17. The method of claim 16, wherein the polymer has a degradation temperature greater than 250° C.
18. The method of claim 16, wherein the polymer has a polymer dispersity index of between 1 and 1.5.
19. The method of claim 16, wherein the polymer has a molecular weight of greater than 500 daltons.
20. The method of claim 10, wherein the top portion of the layer has porosity greater than 25% and an average pore diameter greater than 1 nm.
21. A method comprising:
  at least partially filling a top portion of a layer with a filling material, wherein the layer overlays a substrate, wherein the layer comprises a silica-like dielectric material having a plurality of pores; and
  exposing the top portion of the layer to a plasma such that:
    (i) the top portion of the layer, which faces the plasma, becomes a dense non-porous silicon-containing layer, the plasma consuming all the filling material in the top portion, so that no subsequent burn-out of the filling material in the top portion is required,
    (ii) the bottom portion of the layer, adjacent to the top portion, remains substantially unaffected by the plasma, and
    (iii) a modified structure results that includes the dense non-porous layer, the bottom portion, and the substrate.
22. The method of claim 21, further comprising:
  after forming the dense non-porous layer, performing at least one process on the modified structure; and
  after performing the at least one process, removing all or a portion of the dense non-porous layer.
23. The method of claim 21, wherein the thickness of the dense non-porous layer is controlled by the filling material.
24. The method of claim 21, wherein the filling material comprises at least one of a polymer or organic compound.
25. The method of claim 21, wherein the filling material has a degradation temperature greater than 250° C.
26. The method of claim 21, wherein the top portion has a thickness between 10 and 100 nm.

* * * * *